United States Patent
Ramakrishnan et al.

(10) Patent No.: US 9,431,361 B2
(45) Date of Patent: *Aug. 30, 2016

(54) BALL ARRANGEMENT FOR INTEGRATED CIRCUIT PACKAGE DEVICES

(71) Applicant: BROADCOM CORPORATION, Irvine, CA (US)

(72) Inventors: Arun Ramakrishnan, Irvine, CA (US); Hongyu Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/611,601

(22) Filed: Feb. 2, 2015

(65) Prior Publication Data

US 2015/0145132 A1    May 28, 2015

Related U.S. Application Data

(63) Continuation of application No. 14/031,001, filed on Sep. 18, 2013, now Pat. No. 8,975,746.

(60) Provisional application No. 61/871,812, filed on Aug. 29, 2013.

(51) Int. Cl.
  *H01L 23/488* (2006.01)
  *H01L 23/50* (2006.01)
  (Continued)

(52) U.S. Cl.
  CPC ......... *H01L 24/14* (2013.01); *H01L 23/49822* (2013.01); *H01L 23/49838* (2013.01); *H01L 23/50* (2013.01); *H01L 24/16* (2013.01); *H01L 24/32* (2013.01); *H01L 24/73* (2013.01); *H01L 2224/131* (2013.01); *H01L 2224/14133* (2013.01); *H01L 2224/16225* (2013.01); *H01L 2224/16237* (2013.01); *H01L 2224/32225* (2013.01); *H01L 2224/73204* (2013.01); *H01L 2224/73253* (2013.01); *H01L 2924/14* (2013.01); *H01L 2924/15174* (2013.01); *H01L 2924/15311* (2013.01); *H01L 2924/15321* (2013.01);
(Continued)

(58) Field of Classification Search
  CPC .................. H01L 23/49822; H01L 23/49838; H01L 23/50; H01L 24/14
  USPC .......................... 257/693, 697, 738; 438/108
  See application file for complete search history.

(56) References Cited

U.S. PATENT DOCUMENTS 7,062,742 B2 * 6/2006 Miller ................ G06F 17/5077
                                                          257/700
8,294,259 B2   10/2012 Jiang et al.
(Continued)

*Primary Examiner* — Daniel Shook
(74) *Attorney, Agent, or Firm* — McDermott Will & Emery LLP

(57) ABSTRACT

An integrated circuit package includes a ball arrangement that includes transmitter contact pairs arranged in a first portion of a ball grid array disposed in the integrated circuit package. Each of the transmitter contact pairs include transmitter differential signal contacts. Pairs of the transmitter contact pairs located adjacent to one another are in a staggered arrangement. The ball arrangement also includes receiver contact pairs arranged in a second portion of the ball grid array. Each of the receiver contact pairs include receiver differential signal contacts. Pairs of the receiver contact pairs located adjacent to one another are in a staggered arrangement. The ball arrangement also includes voltage supply contacts arranged at least between every two pairs of the transmitter contact pairs and the receiver contact pairs.

20 Claims, 5 Drawing Sheets

(51) Int. Cl.
　　*H01L 23/00*　　　(2006.01)
　　*H01L 23/498*　　(2006.01)
(52) U.S. Cl.
　　CPC ............... *H01L2924/15331* (2013.01); *H01L 2924/1659* (2013.01); *H01L 2924/16251* (2013.01)

(56) References Cited

U.S. PATENT DOCUMENTS

U.S. PATENT DOCUMENTS 8,324,019 B2　　12/2012　Tang et al.
8,975,746 B1 *　3/2015　Ramakrishnan ........ H01L 23/50
　　　　　　　　　　　　　　　　　　　　　　　257/738

* cited by examiner

BALL ARRANGEMENT FOR INTEGRATED CIRCUIT PACKAGE DEVICES

CROSS-REFERENCE TO RELATED APPLICATIONS

The present application is a continuation of U.S. patent application Ser. No. 14/031,001, filed on Sep. 18, 2013, entitled "BALL ARRANGEMENT FOR INTEGRATED CIRCUIT PACKAGE DEVICES," which in turn claims the benefit of U.S. Provisional Patent Application Ser. No. 61/871,812, titled "BALL ARRANGEMENT FOR INTEGRATED CIRCUIT PACKAGE DEVICES," filed on Aug. 29, 2013, each of which is hereby incorporated by reference in its entirety for all purposes.

TECHNICAL FIELD

The present description relates generally to integrated circuit packaging, and more particularly, but not exclusively, to a ball arrangement in a ball grid array of the integrated circuit packaging.

BACKGROUND

Flip-chip packaging offers short interconnections between a semiconductor chip and a corresponding substrate, supports multi-layer substrate technology for high-capacitance and low-inductance power delivery and provides the most efficient cooling mechanism for heat to be dissipated from the transistor junctions to the environment. As a result of the above properties, flip-chip packaging is a natural choice for chips with significantly fast (data rates up to 100 Gigabits per second per 4-lane core) and power-hungry Serializer-Deserializer (SerDes) cores. However, increases in the density of SerDes cores per chip places limits on the use of flip-chip packaging technology. Although flip-chip packages can support the largest body sizes viably available in the semiconductor industry, adhering to stringent signal integrity requirements of an increasing number of SerDes cores per chip results in the imposition of a limit on the number of SerDes cores that can be supported by a viable package.

SUMMARY

A ball arrangement for high-density networking devices is provided, substantially as illustrated by and/or described in connection with at least one of the figures, as set forth more completely in the claims.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

The subject disclosure provides a ball assignment system that supports an increasing number of SerDes cores while keeping the overall body size of the flip-chip device packaging within assembly supplier limits. The ball assignment system also provides equal or better signal integrity performance in terms of return loss, far-end crosstalk and near-end crosstalk as compared to existing designs with a more conservative ball assignment system.

Figure 1:
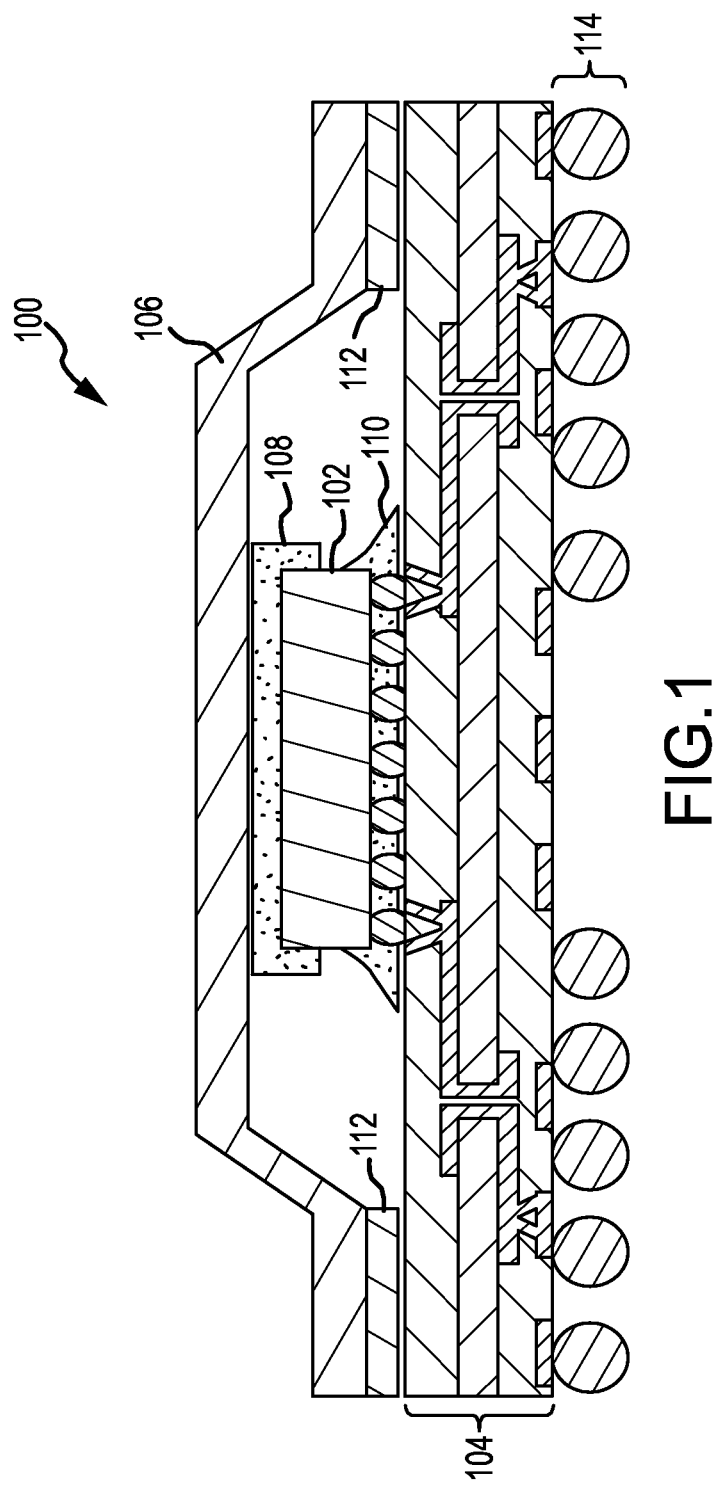
FIG. 1 illustrates a cross-sectional view of an example of an integrated circuit package in accordance with one or more implementations.

FIG. 1 illustrates a cross-sectional view of an example of an integrated circuit package 100 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The integrated circuit package 100 includes a die 102, a substrate 104, and a lid 106. The die 102 is coupled to the substrate 104 via an underfill material 110 and coupled to the lid 106 via an adhesive material 108. The integrated circuit package 100 also includes a lid adhesive 112 between the lid 106 and the substrate 104. The substrate 104 includes solder bumps 114.

The integrated circuit package 100 may be a flip-chip device. In this regard, the die 102 is configured to make direct electrical contact with the substrate 104. The die 102 has a first side and a second side opposite of the first side. Multiple conductive bumps (sometimes referred to as solder bumps) are placed on the first side of the die 102. The first side of the die 102 is arranged to face down and towards a top conductive layer of the substrate 104. The solder bumps on the first side (sometimes referred to as the face-down side) of the die 102 connect directly to the substrate 104. The solder bumps facilitate electrical connections from the first side of the die 102 to the top conductive layer of the substrate 104. The solder bumps may be densely packed together onto the die 102.

The solder bumps 114 are attached to a bottom conductive layer of the substrate 104 to facilitate the electrical interconnections between the substrate 104 and an external printed circuit board (not shown). In some aspects, the solder bumps 114 are arranged in a ball grid array on the bottom conductive layer. In comparison, the solder bumps 114 are less densely packed than the solder bumps on the face-down side of the die 102. Each of the solder bumps on the face-down side of the die 102 is electrically connected to a corresponding one of the solder bumps 114 through conductive segments in one or more layers in the substrate 104 and through one or more electrical vias between the one or more layers of the substrate 104.

The die 102 can include high-speed SerDes cores having several lanes of differential signal pairs. The differential signal pairs include adjacent input/output (I/O) slots that are routed from corresponding solder bumps on the die 102 to adjacent solder bumps 114 through the substrate 104. The conductive traces through the substrate 104 of each signal in a differential signal pair may be identical to one another in terms of the length of conductive segments, the number of vias and the layers on which the conductive segments are routed. However, when the demand for the number of SerDes cores in the die 102 increases, accommodating an increasing number of I/O signals that can be supported by the largest viable integrated circuit package becomes more difficult.

Figure 2:
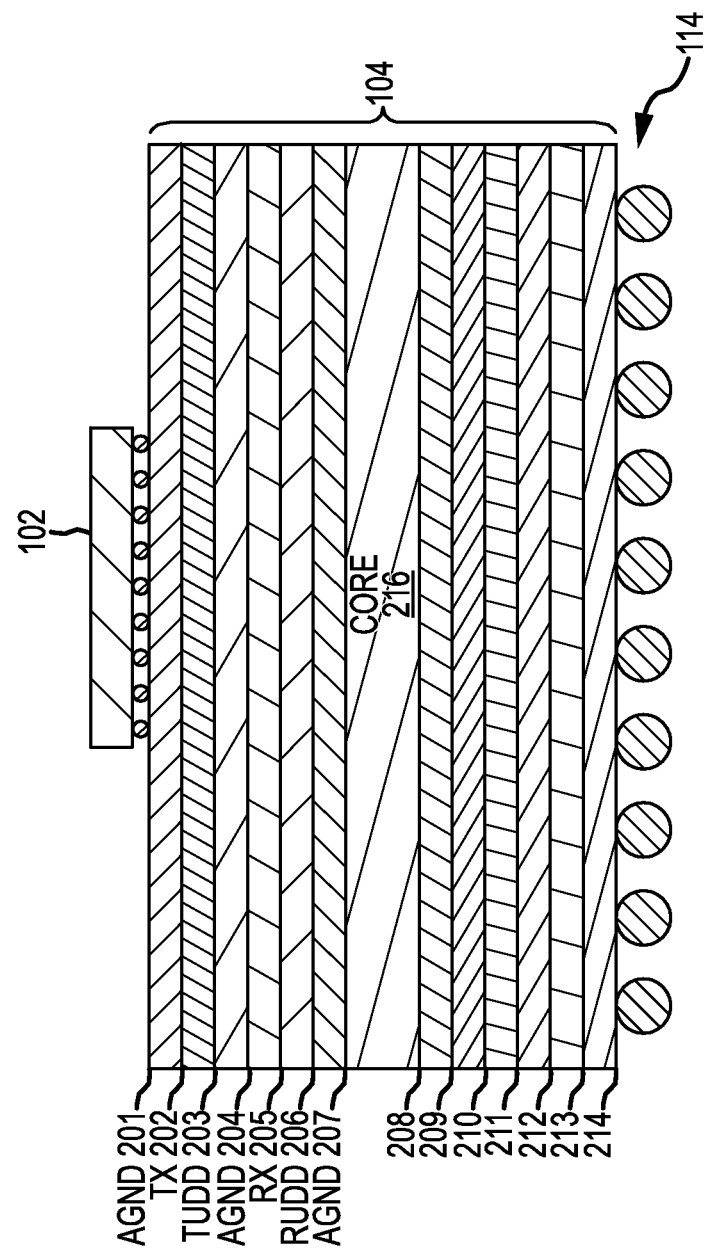
FIG. 2 illustrates a cross-sectional view of an exemplary substrate that can be used in the integrated circuit package of FIG. 1 in accordance with one or more implementations.

FIG. 2 illustrates a cross-sectional view of an exemplary substrate that can be used in the integrated circuit package 100 of FIG. 1 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In some aspects, substrate 104 is a multi-layer substrate. The substrate 104 may be single layered. In either case, the substrate 104 is configured to route signals from generally a central location on a first side of the substrate 104 to more dispersed locations on a second side of the substrate 104 opposite the first side. The substrate 104 may include a greater number of layers or a lesser number of layers, such as having sixteen layers, twelve layers, ten layers, eight layers, six layers, or other number of layers, with signals routed either above or below the core 216.

As shown in FIG. 2, the substrate 104 is a fourteen-layer substrate (e.g., 6/2/6 arrangement). The substrate 104 includes a core layer 216 with six substrate layers on either side of a core layer 216. The substrate 104 has a substrate layer 207 that is placed directly on a first side of the core layer 216. The substrate 104 also includes six substrate layers 201, 202, 203, 204, 205 and 206 on top of the first side of the core layer 216, where the substrate layer 201 is the most distant layer located above the first side of the substrate 104. The substrate 104 also has a substrate layer 208 that is formed directly on a second side of the core layer 216 opposite of the first side. The substrate 104 also includes six substrate layers 209, 210, 211, 212, 213 and 214 located below the second side of the core layer 216, where the substrate layer 214 is the most distant layer located below the second side of the substrate 104.

The first substrate layer 201 is electrically conductive and is a ground (e.g., AGND) layer. The second substrate layer 202 is non-electrically conductive and is a signal layer (e.g., transmitter (TX)). The third substrate layer 203 is electrically conductive and is a power layer for the substrate layer 202 (e.g., TVDD). The fourth substrate layer 204 is electrically conductive and is a ground layer (e.g., AGND). The fifth substrate layer 205 is non-electrically conductive and is a signal layer (e.g., receiver (RX)). The sixth substrate layer 206 is electrically conductive and is a power layer for the substrate layer 205 (e.g., RVDD). The substrate layers 207 and 208 are ground layers and electrically conductive. The substrate layers 209, 211 and 213 may be electrically conductive and referred to as power layers for the core layer 216. In this regard, the substrate layers 210, 212 and 214 may be electrically conductive and referred to as ground layers. In some aspects, the substrate layer 214 is a ball grid layer coupled to the solder bumps 114.

The electrically conductive layers may be disposed between non-electrically conductive layers, which electrically insulate the electrically conductive layers from one another. The integrated circuit (e.g., the integrated circuit 100 of FIG. 1) may be electrically connected to contacts on the most distant layer 201 located above the substrate 104. Similarly, electrical contacts may be provided on the most distant layer 214 located below the substrate 104. The electrical contacts are depicted as the solder bumps 114 but may be of another type, and may be used for making electrical connections between the integrated circuit package 100 and other portions of a larger circuit.

When the demand for the number of SerDes cores in a single chip (e.g., die 102) exceeds the limit that can be supported by the largest viable flip-chip package, semiconductor companies need to develop new design methodologies that compress the real estate occupied by a single SerDes core so that more cores can be accommodated in the same body size. In this regard, the development of a new ball assignment system for a SerDes core is often the first strategy that semiconductor companies adopt.

In one or more implementations, the ball grid layer of the integrated circuit package 100 includes a ball assignment system having staggered adjacent receiver/transmitter pairs, additional ground/power rows between every two receiver/transmitter pairs, standard ground/power rows between receiver and transmitter contacts, adjacent differential receiver/transmitter pairs assigned to non-adjacent ball contacts, offsets between ball contacts and core via contacts, and additional ground/power vias through the substrate layering. In some implementations, the ball assignment system is a three-column arrangement of contacts for four lanes of data.

In some aspects, the ball assignment system includes a specific intra-pair receiver/transmitter signal core via pitch (e.g., 0.5 mm) to increase coupling within differential pairs. The ball assignment system may include a specific inter-pair receiver/transmitter signal core via pitch (e.g., 1.4 mm) to reduce pair-to-pair coupling. The ball assignment system also may include additional ground core vias (e.g., not mapped to existing ground balls) between receiver/transmitter signal core vias to reduce signal coupling. As briefly described above, the ball assignment system, via a trace routing on a substrate layer, may include adjacent differential pairs routed to non-adjacent ball contacts on a ball grid layer to reduce signal coupling.

Figure 3:
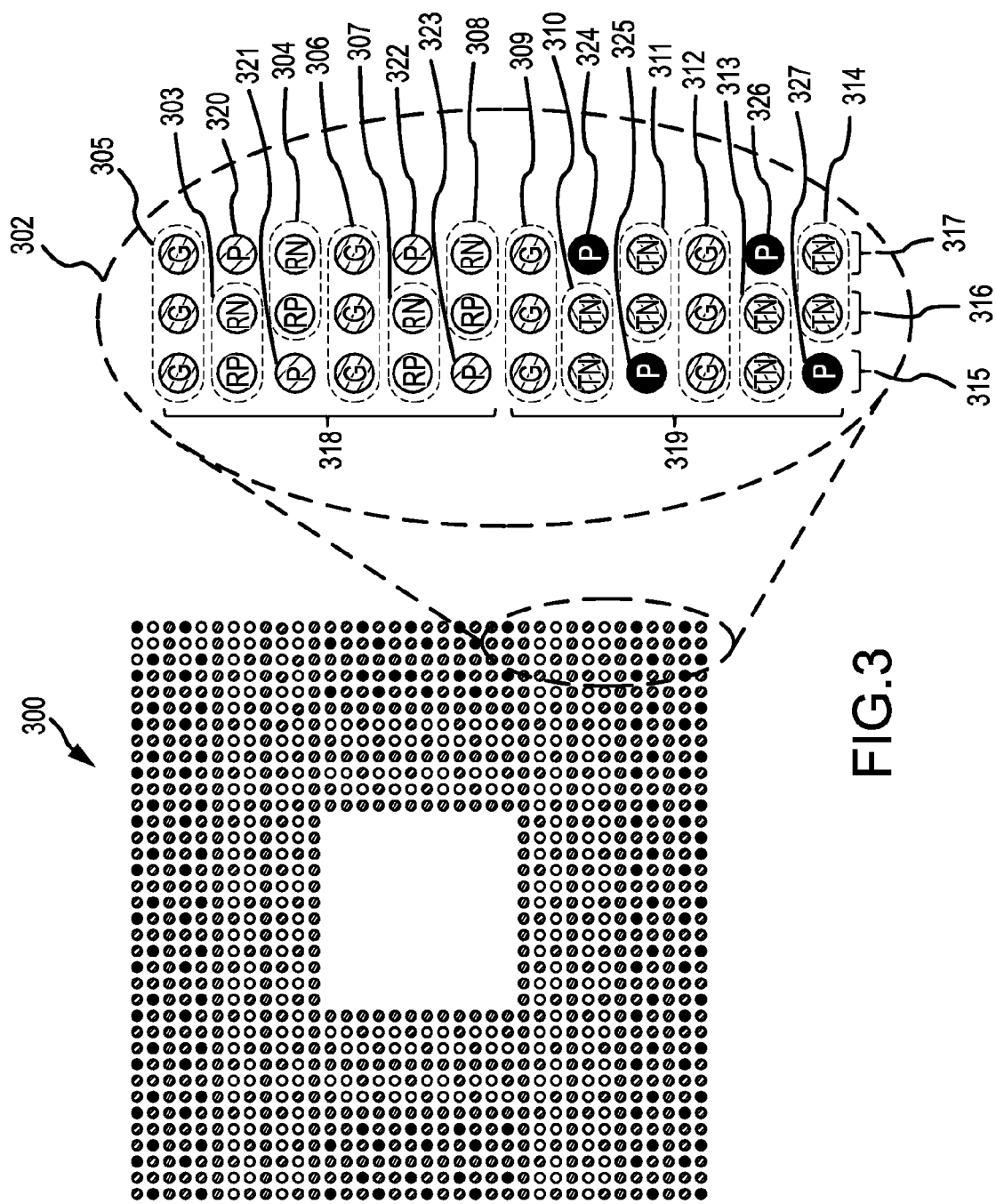
FIG. 3 illustrates a schematic view of a ball arrangement included in the ball grid layer shown in FIG. 2 in accordance with one or more implementations.

FIG. 3 illustrates a schematic view of a ball arrangement included in the ball grid layer 214 shown in FIG. 2 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The substrate layer 214 includes a ball grid array 300 that is arranged based on a ball arrangement. As shown in FIG. 3, the ball grid array 300 includes multiple instances of the ball arrangement. In some aspects, the ball grid array 300 includes different ball arrangements to accommodate different high-speed high-density networking applications.

As shown in FIG. 3, a fragmented portion 302 of the ball grid array 300 is enlarged to show the ball arrangement. The ball arrangement is a three-column wide arrangement of electrical contacts configured to support four-lane SerDes cores (e.g., four data paths per core). In some aspects, the ball arrangement includes a different number of columns to facilitate four-lane SerDes cores (e.g., four-column wide ball arrangement, six-column wide ball arrangement).

The fragmented portion 302 includes a first portion 318 of the ball grid array 300, a second portion 319 of the ball grid array 300, a first column 315, a second column 316, and a third column 317. Within the first portion 318, the ball arrangement includes ground contacts 305 and 306, receiver contact pairs 303, 304, 307 and 308, and power contacts 320, 321, 322 and 323. Within the second potion 319, the ball arrangement includes ground contacts 309 and 312, transmitter contact pairs 310, 311, 313 and 314, and power contacts 324, 325, 326 and 327.

The receiver contact pairs 303, 304, 307 and 308 are arranged in the first portion 318 of the ball grid array 300. Each of the plurality of receiver contact pairs 303, 304, 307 and 308 includes receiver differential signal contacts (e.g., complementary signals). By way of illustration, receiver contact pair 303 includes an electrical contact for a positive (or true) signal (or terminal) and an electrical contact for a negative (or false) signal (or terminal).

Pairs of the receiver contact pairs 303, 304, 307 and 308 that are located adjacent to one another are in a staggered arrangement. By way of illustration, the staggered arrangement of the receiver contact pairs includes a first differential receiver contact pair (e.g., receiver contact pair 303) arranged on a same row across the first column 315 and the second column 316 of the ball arrangement and a second differential receiver contact pair (e.g., receiver contact pair 304) arranged on a same row across the second column 316 and the third column 317 of the ball arrangement. Because the first and second differential receiver contact pairs 303 and 304 are arranged in adjacent rows but offset by one column, the two receiver contact pairs are arranged to be staggered.

The staggered arrangement of the receiver contact pairs also includes a third differential receiver contact pair (e.g., receiver contact pair 307) arranged on a same row across the first column 315 and the second column 316 of the ball arrangement and a fourth differential receiver contact pair (e.g., receiver contact pair 308) arranged on a same row across the second column 316 and the third column 317 of the ball arrangement. Because the third and fourth differential receiver contact pairs 307 and 308 are arranged in adjacent rows but offset by one column, the two receiver contact pairs are arranged to be staggered.

The transmitter contact pairs 310, 311, 313 and 314 are arranged in the second portion 319 of the ball grid array 300. Each of the transmitter contact pairs 310, 311, 313 and 314 includes transmitter differential signal contacts. By way of illustration, transmitter contact pair 310 includes an electrical contact for a positive (or true) signal (or terminal) and an electrical contact for a negative (or false) signal (or terminal). In some aspects, the second portion 319 is located closer to a package edge of the ball grid array 300 than the first portion 318.

Similarly, pairs of the transmitter contact pairs 310, 311, 313 and 314 located adjacent to one another are in a staggered arrangement. The staggered arrangement of the plurality of transmitter contact pairs includes a first differential transmitter contact pair arranged on a same row across a first column and a second column of the ball arrangement and a second differential transmitter contact pair arranged on a same row across the second column and a third column of the ball arrangement, wherein the first and second differential transmitter contact pairs are arranged in adjacent rows.

The staggered arrangement of the plurality of transmitter contact pairs also includes a third differential transmitter contact pair arranged on a same row across first and second columns of the ball arrangement and a fourth differential transmitter contact pair arranged on a same row across the second and third columns of the ball arrangement, wherein the third and fourth differential transmitter contact pairs are arranged in adjacent rows.

Given that the ball arrangement allows the ball grid array 300 to support four-lane SerDes cores, each of the receiver contact pairs is associated with a respective data path. By way of example, the first differential receiver contact pair (e.g., receiver contact pair 303) is associated with a first lane of data, the third differential receiver contact pair (e.g., receiver contact pair 307) is associated with a second lane of data, the second differential receiver contact pair (e.g., receiver contact pair 304) is associated with a third lane of data, and the fourth differential receiver contact pair (e.g., receiver contact pair 308) is associated with a fourth lane of data. In this regard, adjacent lanes of data for receiver signals are assigned to non-adjacent electrical contacts on the ball grid array 300 to reduce signal coupling between adjacent lanes in the die at the ball grid layer 214 (FIG. 2).

Similarly, the transmitter contact pairs are associated with respective SerDes core data paths. By way of example, the first differential transmitter contact pair (e.g., transmitter contact pair 310) is associated with a first lane of data, the third differential transmitter contact pair (e.g., transmitter contact pair 313) is associated with a second lane of data, the second differential transmitter contact pair (e.g., transmitter contact pair 311) is associated with a third lane of data, and the fourth differential transmitter contact pair (e.g., transmitter contact pair 314) is associated with a fourth lane of data. As stated above, adjacent lanes of data for transmitter signals are assigned to non-adjacent electrical contacts on the ball grid array 300.

The ball arrangement includes voltage supply contacts (e.g., ground contacts 305, 306, 309 and 312) arranged at least between every two pairs of the receiver contact pairs and the receiver contact pairs. In this regard, the row of ground contacts 306 are arranged between the receiver contact pairs 304 and 307, where the receiver contact pairs 303 and 304 are adjacent pairs and the receiver contact pairs 307 and 308 are adjacent pairs. In some aspects, the voltage supply contacts include a row of power contacts arranged between every two contact pairs depending on implementation. In some implementations, at least one row of voltage supply contacts is arranged between each differential signal pair (e.g., receiver contact pairs, transmitter contact pairs).

The first and second portions 318 and 319 of the ball grid array 300 may be separated by at least one row consisting of the voltage supply contacts. In this regard, the row of ground contacts 309 separate the receiver and transmitter differential signals. In some aspects, power contacts (not shown) are arranged to separate the receiver and transmitter differential signal contacts.

In some aspects, the transmitter contact pairs are associated with a first type of power contacts and the receiver contact pairs are associated with a second type of power contacts. By way of example, the receiver contact pair 303 is associated with a power contact 320 configured to electrically connect to a voltage supply for receiver signals (e.g., RVDD). The power contacts 321-323 may be associated with a similar power supply for receiver signals. On the other hand, the transmitter contact pair 310 is associated with a power contact 324 configured to electrically connect to a voltage supply for transmitter signals (e.g., TVDD). The power contacts 325-327 may be associated with a similar power supply for transmitter signals.

As shown in FIG. 3, a first of the supply voltage contacts (e.g., power contact 320) is arranged in the third column 317 on a same row as the first differential receiver contact pair (e.g., receiver contact pair 3030) and a second of the supply voltage contacts (e.g., power contact 321) is arranged in the first column 315 on a same row as the second differential receiver contact pair (e.g., receiver contact pair 304). A third of the supply voltage contacts (e.g., power contact 322) is arranged in the third column 317 on a same row as the third differential receiver contact pair (e.g., receiver contact pair 307) and a fourth of the supply voltage contacts (e.g., power contact 323) is arranged in the first column 315 on a same row as the fourth differential receiver contact pair (e.g., receiver contact pair 308).

Within the second portion 319, power contact 324 is arranged in the third column 317 on a same row as the transmitter contact pair 310 and power contact 325 is arranged in the first column 315 on a same row as the transmitter contact pair 311. In addition, power contact 326 is arranged in the third column 317 on a same row as the transmitter contact pair 313 and the power contact 327 is arranged in the first column 315 on a same row as the transmitter contact pair 314.

In some aspects, the ball arrangement includes a number of ground contacts that is greater than a number of power contacts. Alternatively, the ball arrangement may include a number of power contacts that is greater than a number of ground contacts. In some implementations, the ball arrangement includes electrical contacts for clock signals, test signals or other similar physical signals from the die chip (e.g., die 102 of FIG. 1).

Figure 4:
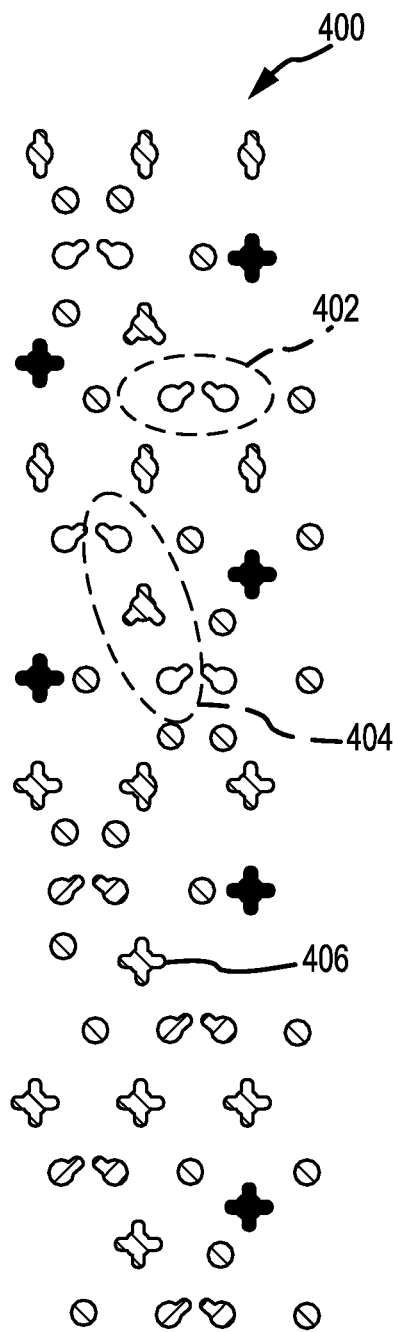
FIG. 4 illustrates a schematic view of a substrate core via layout corresponding to the core layer shown in FIG. 2 in accordance with one or more implementations.

FIG. 4 illustrates a schematic view of a substrate core via layout 400 corresponding to the core layer 216 shown in FIG. 2 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Here, the substrate core via layout 400 includes the aforementioned ball arrangement. The substrate core via layout 400 may represent a fragmented portion of the full layout included within the core (e.g., core layer 216 of FIG. 2) of the integrated circuit package 100 (FIG. 1). In this regard, the full layout at the core layer 216 may include multiple instances of the substrate core via layout 400.

The substrate core via layout 400 includes an intra-pair differential signal core via pitch 402, an inter-pair differential signal core via pitch 404, and a supply voltage core via 406. The core layer 216 may include through-vias to provide interconnections between top and bottom substrate layers. The core layer 216 may include blind-vias to provide interconnections from a top or bottom layer to an inner substrate layer. The core layer 216 also may include embedded-vias to provide interconnections between a number of inner substrate layers.

The intra-pair differential signal core via pitch 402 provides a first via associated with a first differential signal (e.g., positive receiver signal) and a second via associated with a second differential signal (e.g., negative receiver signal). The via pitch (or distance) between the first and second vias can be in a range of 0.4 millimeters (mm) to 1.0 mm. In some aspects, the intra-pair via pitch is 0.5 mm to increase coupling within the differential pair. In some implementations, the intra-pair differential signal core via pitch 402 is applicable to both receiver and transmitter signal contacts.

The inter-pair differential signal core via pitch 404 provides a distance between two adjacent differential pairs (e.g., receiver contact pairs 307 and 308 of FIG. 3). That is, there is no row of voltage supply contacts separating the two differential pairs at either the ball grid layer 214 (FIG. 2) or the core layer 216. The via pitch between the two adjacent differential pairs can be approximately 1.4 mm to reduce pair-to-pair coupling. In some aspects, the inter-pair differential signal core via pitch 404 is applicable to both receiver and transmitter signal contacts.

The supply voltage core via 406 represents a via located between adjacent differential signals (e.g., receiver signals, transmitter signals) to reduce signal coupling. The supply voltage core via 406 may be in addition to the row of supply voltage contacts arranged between receiver and transmitter contact pairs including between every two contact pairs. The supply voltage core via 406 may be associated with either a ground contact or a power contact. As such, the number of ground contacts may be greater than the number of power contacts, and vice versa, depending on implementation.

In some aspects, the core layer vias are offset from the ball pads (or electrical contacts) on the ball grid layer 214 (FIG. 2) to intentionally increase the distance between the core layer vias and, therefore, reduce any coupling between adjacent differential signals.

Figure 5:
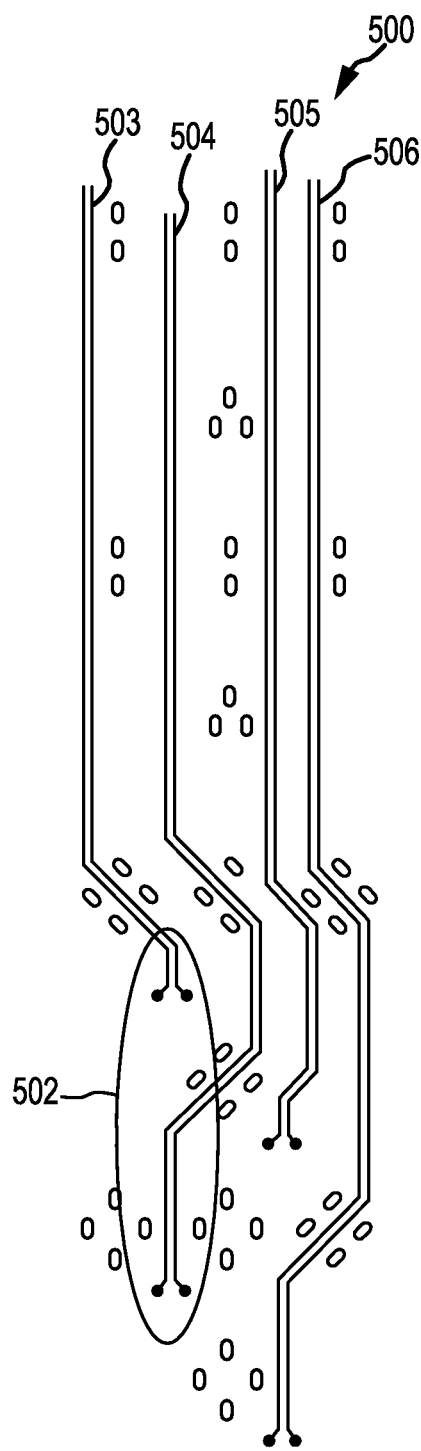
FIG. 5 illustrates a schematic view of a trace routing layout corresponding to the transmitter substrate layer shown in FIG. 2 in accordance with one or more implementations.

FIG. 5 illustrates a schematic view of a trace routing layout 500 corresponding to the substrate layer 202 shown in FIG. 2 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The trace routing layout 500 includes four adjacent lanes of data for the transmitter signals. In some aspects, the trace routing layout 500 applies to data paths for the receiver signals. Here, the trace routing layout 500 shows two adjacent traces for corresponding to respective lanes of data (e.g., trace 503 associated with a first lane of data, trace 504 associated with a second lane of data) assigned to non-adjacent ball pads (or electrical contacts) to reduce signal coupling between the adjacent traces. Similarly, trace 504 and trace 505 associated with a third lane of data may be assigned to non-adjacent ball pads at the ball grid layer 214. Furthermore, trace 505 and trace 506 associated with a fourth lane of data may be assigned to non-adjacent ball pads at the ball grid layer 214. In some aspects, the assignment of adjacent differential signal pairs to non-adjacent balls pads is applicable to both receiver and transmitter signals.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An integrated circuit package, comprising:
   a ball arrangement comprising:
      a plurality of contact pairs arranged in a ball grid array disposed in the integrated circuit package, each of the plurality of contact pairs comprising differential signal contacts, wherein at least two pairs of the plurality of contact pairs are located adjacent to one another in a staggered arrangement; and
      a plurality of rows of voltage supply contacts, wherein the at least two pairs are located between at least two rows of the plurality of rows of voltage supply contacts.

2. The integrated circuit package of claim 1, wherein the staggered arrangement of the at least two pairs comprises:
   a first differential contact pair arranged on a first row across a first column and a second column of the ball arrangement,
   a second differential contact pair arranged on a second row across the second column and a third column of the ball arrangement, and
   the first row and the second row are adjacent rows of the ball arrangement.

3. The integrated circuit package of claim 2, wherein:
   each of the at least two pairs is a transmitter contact pair, or
   each of the at least two pairs is a receiver contact pair.

4. The integrated circuit package of claim 1, wherein each voltage supply contact of the plurality of rows of voltage supply contacts includes a ground contact.

5. The integrated circuit package of claim 1, wherein the plurality of contact pairs comprises a plurality of transmitter contact pairs and a plurality of receiver contact pairs.

6. The integrated circuit package of claim 5, further comprising a plurality of power contacts, wherein each power contact is one of a first type of power contact associated with the plurality of transmitter contact pairs or a second type of power contact associated with the plurality of receiver contact pairs.

7. The integrated circuit package of claim 1, wherein:
   the ball arrangement comprises a three-column wide arrangement of contacts for four lanes of data, and
   the ball grid array comprises one or more of the three-column wide arrangement of contacts.

8. The integrated circuit package of claim 1, wherein a first pair of the at least two pairs and a second pair of the at least two pairs are on adjacent rows of the ball grid array.

9. An integrated circuit package, comprising:
   a pattern of electrical contacts comprising:
      a first row comprising a first differential signal contact pair;
      a second row comprising a second differential signal contact pair; and
      a third row comprising at least one voltage supply contact,
   wherein:
      the first row is adjacent to at least one of the second row or the third row,
      the second row is adjacent to the third row, and
      the at least one voltage supply contact is arranged on a same column as one signal contact of the first differential signal contact pair and one signal contact of the second differential signal contact pair.

10. The integrated circuit package of claim 9, wherein the first differential signal contact pair and the second differential signal contact pair are in a staggered arrangement.

11. The integrated circuit package of claim 9, wherein:
    the first row further comprises a first voltage supply contact, and
    the second row further comprises a second voltage supply contact.

12. The integrated circuit package of claim 11, wherein the first voltage supply contact is arranged on a same column as one signal contact of the second differential signal contact pair.

13. The integrated circuit package of claim 11, wherein:
the at least one voltage supply contact comprises at least three voltage supply contacts,
a first voltage supply contact of the at least three voltage supply contacts is arranged on a same column as one signal contact of the first differential signal contact pair,
a second voltage supply contact of the at least three voltage supply contacts is arranged on a same column as another signal contact of the first differential signal contact pair, and
a third voltage supply contact of the at least three voltage supply contacts is arranged on a same column as the first voltage supply contact of the first row.

14. The integrated circuit package of claim 9, wherein each of the first differential signal contact pair or the second differential signal contact pair is a receiver contact pair or a transmitter contact pair.

15. The integrated circuit package of claim 9, wherein:
the pattern of electrical contacts further comprises a fourth row consisting of voltage supply contacts,
the first row is adjacent to the second row, and
the first row is adjacent to the fourth row.

16. The integrated circuit package of claim 9, wherein:
the pattern of electrical contacts comprises a first column, a second column, and a third column;
the first differential signal contact pair is arranged across the first column and the second column; and
the second differential signal contact pair is arranged across the second column and the third column.

17. An integrated circuit package, comprising:
a pattern of electrical contacts comprising:
a first column comprising a first signal contact, a first voltage supply contact, and a second voltage supply contact;
a second column comprising a second signal contact, a third signal contact, and a third voltage supply contact; and
a third column comprising a fourth signal contact, a fourth voltage supply contact, and a fifth voltage supply contact,
wherein:
each of the first, second, third, and fourth signal contacts is one of a transmitter contact or a receiver contact,
the second, third, and fifth voltage supply contacts are arranged in a same row, and
the first signal contact and fourth voltage supply contact are in a same row.

18. The integrated circuit package of claim 17, wherein:
the first column is adjacent to the second column,
the second column is adjacent to the third column, and
the first signal contact, the second signal contact, and the fourth voltage supply contact are in a same row.

19. The integrated circuit package of claim 18, wherein the first signal contact and the second signal contact form a first differential signal contact pair.

20. The integrated circuit package of claim 18, wherein the third signal contact, the fourth signal contact, and the first voltage supply contact are arranged in a same row.

* * * * *